US008643358B2

(12) United States Patent
Yoon

(10) Patent No.: US 8,643,358 B2
(45) Date of Patent: Feb. 4, 2014

(54) OSCILLATOR

(75) Inventor: Jang Hwan Yoon, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 401 days.

(21) Appl. No.: 13/171,046

(22) Filed: Jun. 28, 2011

(65) Prior Publication Data

US 2012/0007581 A1 Jan. 12, 2012

(30) Foreign Application Priority Data

Jul. 9, 2010 (KR) ........................ 10-2010-0066509

(51) Int. Cl.
*G01R 19/00* (2006.01)

(52) U.S. Cl.
CPC .................... *G01R 19/0092* (2013.01)
USPC ........................................................ 324/76.11

(58) Field of Classification Search
None
See application file for complete search history.

(56) References Cited

U.S. PATENT DOCUMENTS 7,075,353 B1 * 7/2006 Wan et al. .................. 327/295
7,312,509 B2 * 12/2007 Han et al. .................. 257/469

FOREIGN PATENT DOCUMENTS

| KR | 1019980069094 | 10/1998 |
| KR | 1020050108150 | 11/2005 |
| KR | 1020060059283 | 6/2006 |
| KR | 1020080021393 | 3/2008 |

OTHER PUBLICATIONS

Notice of Allowance issued from the Korean Intellectual Property Office on May 21, 2012.

* cited by examiner

*Primary Examiner* — Paresh Patel
(74) *Attorney, Agent, or Firm* — IP & T Group LLP

(57) ABSTRACT

An oscillator includes a reference voltage generator configured to generate a reference voltage varying according a change in temperature and an external voltage, a first comparison voltage generator configured to output a first comparison voltage to a first node in response to the reference voltage, a second comparison voltage generator configured to output a second comparison voltage to a second node in response to the reference voltage, a first comparison circuit configured to compare the reference voltage and the first comparison voltage and to generate a first input voltage as a result of the comparison, a second comparison circuit configured to compare the reference voltage and the second comparison voltage and to generate a second input voltage as a result of the comparison, and a clock generator configured to output a clock signal that oscillates in response to the first and second input voltages.

22 Claims, 3 Drawing Sheets

OSCILLATOR

CROSS-REFERENCE TO RELATED APPLICATION

Priority to Korean patent application number 10-2010-0066509 filed on Jul. 9, 2010, the entire disclosure of which is incorporated by reference herein, is claimed.

BACKGROUND

Exemplary embodiments relate to an oscillator and, more particularly, to an oscillator including an SR latch.

A clock signal for operating internal devices is used in semiconductor memory devices, IC chips, micro controllers, and pump circuits. An oscillator generates the clock signal for operating the internal devices.

The cycle of a clock signal (that is, the output signal of a common oscillator) is greatly changed according to a change in the level of an external voltage and temperature. When the cycle of the clock signal is changed according to such factors, a system operating in synchronization with the clock signal is greatly influenced. In order to address this concern, a circuit in which a constant current source is coupled to an inverter, a resistor and a capacitor, or a comparator may be used in order to obtain an RC delay effect. Even in this case, the cycle of the clock signal is changed according to a change in the level of an external voltage and temperature.

BRIEF SUMMARY

Exemplary embodiments relate to an oscillator in which a reference voltage generated by a reference voltage generator is shared by the switch circuits and the comparators of the oscillator, thereby compensating for a change in the level of an external voltage and temperature.

An exemplary oscillator according to an aspect of the present disclosure includes a reference voltage generator configured to generate a reference voltage varying according a change in temperature and an external voltage, a first comparison voltage generator configured to output a first comparison voltage to a first node in response to the reference voltage, a second comparison voltage generator configured to output a second comparison voltage to a second node in response to the reference voltage, a first comparator configured to compare the reference voltage and the first comparison voltage, and to generate a first input voltage as a result of the comparison, a second comparator configured to compare the reference voltage and the second comparison voltage, and to generate a second input voltage as a result of the comparison, and a clock generator configured to output a clock signal that oscillates in response to the first and second input voltages.

The reference voltage generator may include a first resistor and a diode which are coupled in series between an external voltage terminal having the external voltage and a ground terminal.

The diode may be implemented using an NMOS transistor having a source and a gate coupled together, and voltage supplied to the source of the NMOS transistor may be outputted as the reference voltage.

The first comparison voltage generator may delay the discharge time of the first node according to a change in the level of the reference voltage.

The first comparison voltage generator may include a second switch configured to transfer the external voltage to the first node, a first capacitor configured to delay the discharge time of the first node, a third switch configured to control discharging of the first node according to the level of the reference voltage, and a second resistor and a fourth switch coupled in series between the third switch and a ground terminal.

The second switch may be implemented using a PMOS transistor for coupling the first node and an external voltage terminal having the external voltage in response to a first output signal generated by the clock generator.

The third switch may be implemented using an NMOS transistor that turns on/off in response to the reference voltage.

The fourth switch may be implemented using an NMOS transistor that turns on/off in response to the first output signal.

The second comparison voltage generator may delay the discharge time of the second node according to a change in the level of the reference voltage.

The second comparison voltage generator may include a fifth switch configured to transfer the external voltage to the second node, a second capacitor configured to delay the discharge time of the second node, a sixth switch configured to control discharging of the second node according to the level of the reference voltage, and a third resistor and a seventh switch coupled in series between the sixth switch and the ground terminal.

The fifth switch may be implemented using a PMOS transistor for coupling the second node and the external voltage terminal having the external voltage in response to a second output signal generated by the clock generator.

The sixth switch may be implemented using an NMOS transistor that turns on/off in response to the reference voltage.

The seventh switch may be implemented using an NMOS transistor that turns on/off in response to the second output signal.

When an enable signal is activated, the first comparator may compare the reference voltage and the first comparison voltage and output the first input voltage to a first input node.

When the enable signal is activated, the second comparator may compare the reference voltage and the second comparison voltage and output the second input voltage to a second input node.

The clock generator may be implemented using an SR latch for outputting a first output signal to a first output node and a second output signal (that is, the clock signal) to a second output node, in response to the first input voltage and the second input voltage. The first output signal or the second output signal may also be outputted as the clock signal. Further, the clock signal may oscillate at a predetermined frequency.

The oscillator may further include a first reset circuit coupled to the output node of the first comparator and configured to reset the output node of the first comparator when the enable signal is deactivated.

The first reset circuit may be implemented using an NMOS transistor.

The oscillator may further include a second reset circuit coupled to the output node of the second comparator and configured to reset the output node of the second comparator when the enable signal is deactivated.

The second reset circuit may be implemented using a PMOS transistor.

DESCRIPTION OF EMBODIMENT

Hereinafter, an exemplary embodiment of the present disclosure will be described in detail with reference to the accompanying drawings. The figures are provided to allow those having ordinary skill in the art to understand the scope of the embodiment of the disclosure.

Figure 1:
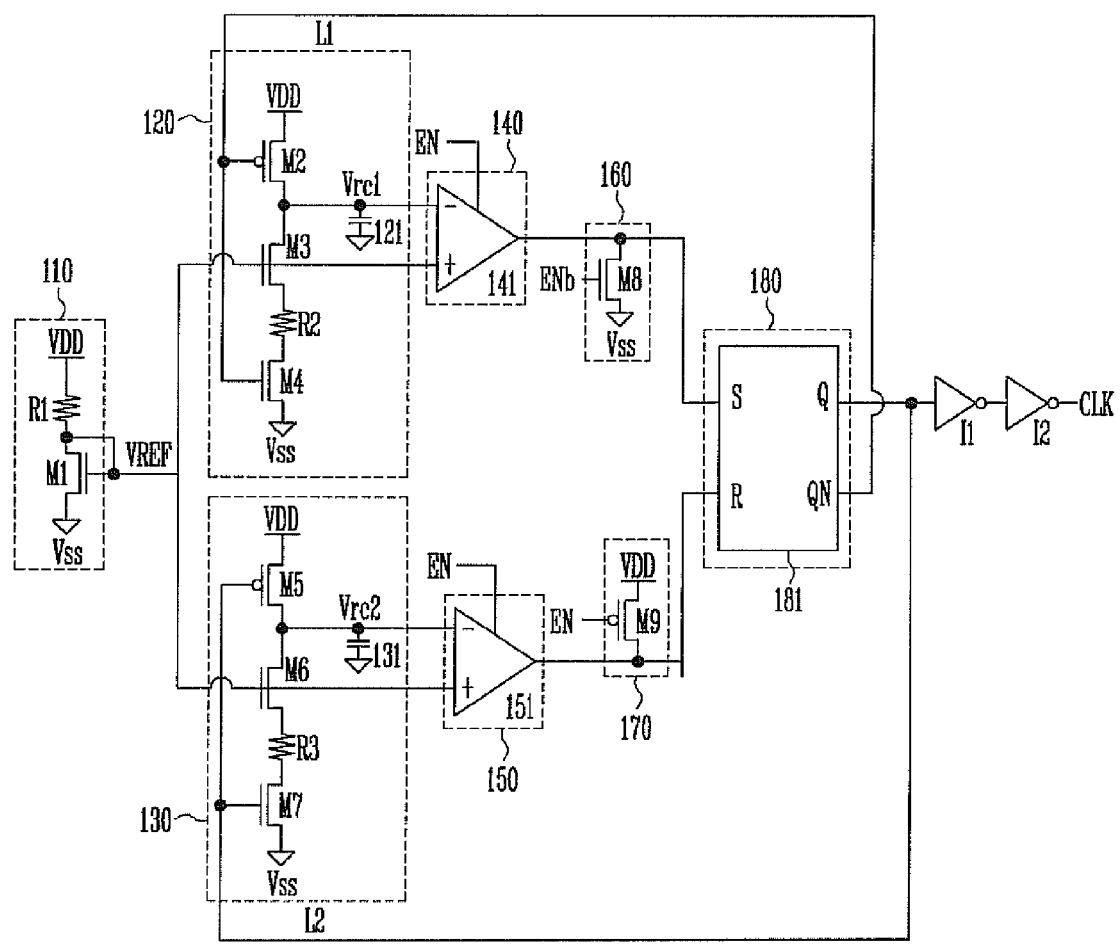
FIG. 1 is a circuit diagram of an oscillator according to an exemplary embodiment of this disclosure.

FIG. 1 is a circuit diagram of an oscillator according to an exemplary embodiment of this disclosure.

Referring to FIG. 1, the oscillator includes a reference voltage generator 110, a first comparison voltage generator 120, a second comparison voltage generator 130, a first comparison circuit 140, a second comparison circuit 150, a first reset circuit 160, a second reset circuit 170, and a clock generator 180.

The reference voltage generator 110 generates a reference voltage VREF which varies according to a change of temperature and an external power source. The reference voltage generator 110 includes a first resistor R1 and a first switch M1 coupled in series between an external voltage terminal VDD and a ground terminal Vss. The first resistor R1 is coupled between the external voltage terminal VDD and the first switch M1. The first switch M1 is coupled between the first resistor R1 and the ground terminal Vss and is implemented using an NMOS transistor functioning as a diode. That is, the NMOS transistor is diode-coupled. Therefore, voltage supplied to the source of the NMOS transistor is also supplied to the gate of the NMOS transistor. The voltage supplied to the gate of the first switch M1 is the reference voltage VREF.

The first comparison voltage generator 120 generates a first comparison voltage Vrc1 in response to the reference voltage VREF and a first output signal L1. The first comparison voltage generator 120 includes a second switch M2, a third switch M3, a second resistor R2, and a fourth switch M4 which are coupled in series between the external voltage terminal VDD and the ground terminal Vss. The second switch M2 may be implemented using a PMOS transistor for coupling the external voltage terminal VDD and the third switch M3 in response to the first output signal L1. The third switch M3 may be implemented using an NMOS transistor for coupling the second switch M2 and the second resistor R2 in response to the reference voltage VREF. A first comparison voltage Vrc1 is outputted through a first node between the second and third switches M2 and M3. In particular, when temperature and the external voltage VDD are lowered, the third switch M3 functions to delay the discharge time of the first node (from which the first comparison voltage Vrc1 is outputted) by reducing the amount of current it passes. The second resistor R2 is coupled between the third switch M3 and the fourth switch M4. The fourth switch M4 may be implemented using an NMOS transistor. Further, the fourth switch M4 couples the second resistor R2 and the ground terminal Vss in response to the first output signal L1. The first comparison voltage generator 120 also includes a first capacitor 121 for delaying the discharge time of the first node from which the first comparison voltage Vrc1 is outputted.

The second comparison voltage generator 130 generates a second comparison voltage Vrc2 in response to the reference voltage VREF and a second output signal L2. The second comparison voltage generator 130 includes a fifth switch M5, a sixth switch M6, a third resistor R3, and a seventh switch M7 which are coupled in series between the external voltage terminal VDD and the ground terminal Vss. The fifth switch M5 may be implemented using a PMOS transistor for coupling the external voltage terminal VDD and the sixth switch M6 in response to the second output signal L2. The sixth switch M6 may be implemented using an NMOS transistor for coupling the fifth switch M5 and the third resistor R3 in response to the reference voltage VREF. A second comparison voltage Vrc2 is outputted through a second node between the fifth and sixth switches M5 and M6. In particular, when temperature and the external voltage VDD are lowered, the sixth switch M6 functions to delay the discharge time of the second node (from which the second comparison voltage Vrc2 is outputted) by delaying the amount of current it passes. The third resistor R3 is coupled between the sixth switch M6 and the seventh switch M7. The seventh switch M7 may be implemented using an NMOS transistor. Further, the seventh switch M7 couples the third resistor R3 and the ground terminal Vss in response to the second output signal L2. The second comparison voltage generator 130 generates the second comparison voltage Vrc2 in response to the second output signal L2 and the reference voltage VREF. The second comparison voltage generator 130 also includes a second capacitor 131 for delaying the discharge time of the second node from which the second comparison voltage Vrc2 is outputted.

The first comparison circuit 140 operates according to an enable signal (e.g., when an enable signal EN is activated). Further, the first comparison circuit 140 is configured to compare the reference voltage VREF and the first comparison voltage Vrc1, and output a result of the comparison to a first input node S. The first comparison circuit 140 may comprise a first comparator 141, which may be a voltage comparator.

The second comparison circuit 150 operates according to an enable signal EN (e.g., when the enable signal EN is activated). Further, the second comparison circuit 150 is configured to compare the reference voltage VREF and the second comparison voltage Vrc2, and output a result of the comparison to a second input node R. The second comparison circuit 150 may comprise a second comparator 151, which may be a voltage comparator.

The first reset circuit 160 is configured to reset the first input node S to a low level in response to an inverse enable signal ENb. As shown in FIG. 1, the first reset circuit 160 may be implemented using an eighth NMOS transistor M8.

The second reset circuit 170 is configured to reset the second input node R to a low level in response to the enable signal EN. As shown in FIG. 1, the second reset circuit 170 may be implemented using a ninth PMOS transistor M9.

The clock generator 180 may be implemented using an SR latch 181 for outputting the first output signal L1 through a first output node QN and the second output signal L2 through a second output node Q, in response to voltages supplied to the first input node S and the second input node R. Here, the second output signal L2 outputted through the second output node Q is also used to generate a clock signal CLK outputted via first and second inverters I1 and I2.

Figure 2:
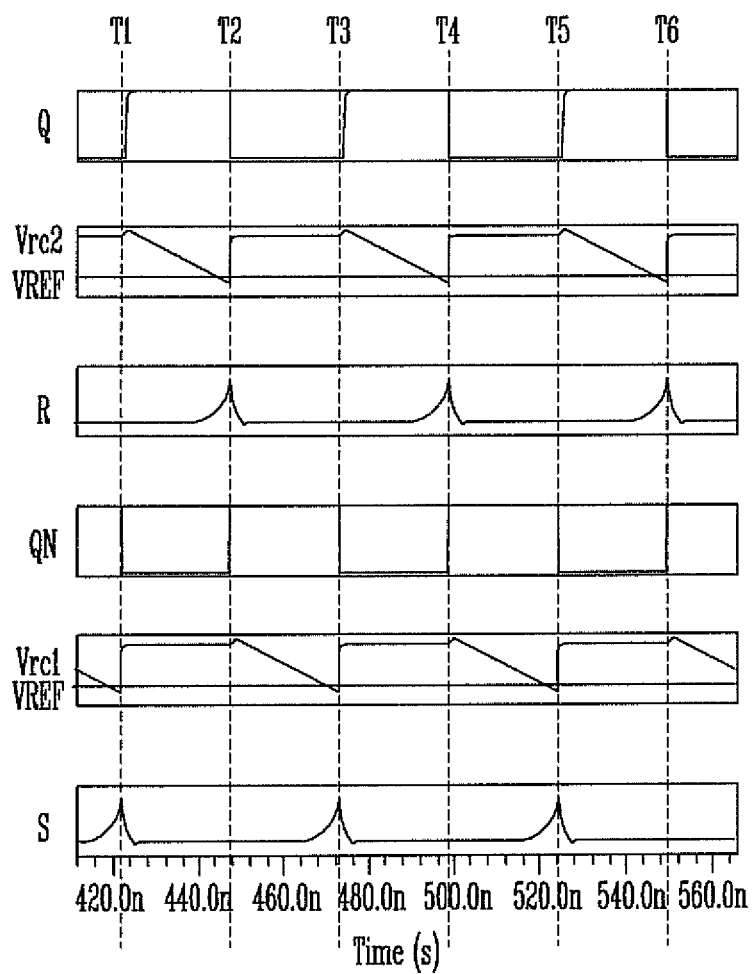
FIG. 2 is a timing diagram illustrating the operation of the oscillator shown in FIG. 1.

FIG. 2 is a timing diagram illustrating an operation of the oscillator shown in FIG. 1.

The oscillator is reset as follows.

The first input node S of the SR latch 181 is reset to a high logic level, the second input node R of the SR latch 181 is reset to a low logic level, the first output node QN of the SR latch 181 is reset to a low logic level, and the second output node Q of the SR latch 181 is reset to a high logic level. Accordingly, the first comparison voltage Vrc1 becomes a high logic level, and the second comparison voltage Vrc2 becomes a low logic level.

When the reference voltage VREF is generated by the reference voltage generator 110, the reference voltage VREF is supplied to the first and second comparison voltage generators 120 and 130 and the first and second comparison circuits 140 and 150.

In a period T1-T2, when the enable signal EN becomes a high level, the first and second comparators 141 and 151 are activated. The first comparator 141 compares the reference voltage VREF and the first comparison voltage Vrc1, and outputs a result of the comparison as the first comparison voltage Vrc1. The second comparator 151 compares the reference voltage VREF and the second comparison voltage Vrc2, and outputs a result of the comparison as the second comparison voltage Vrc2. At this time, since the first comparison voltage Vrc1 is at a high logic level, the first comparison circuit 140 outputs the first comparison voltage Vrc1 of a low logic level. Meanwhile, the level of the second comparison voltage Vrc2 supplied to the second comparison circuit 150 is gradually lowered due to a pre-charge voltage applied by the second capacitor 131. Accordingly, the second comparator 151 generates the second comparison voltage Vrc2 of a low logic level until the level of the second comparison voltage Vrc2 is lower than the reference voltage VREF.

In a period T2-T3, the second comparison circuit 150 outputs the second comparison voltage Vrc2 of a high logic level, and so the second comparison voltage Vrc2 of a high logic level is supplied to the second input node R of the SR latch 181. At this time, since the first comparison voltage Vrc1 of a low logic level is supplied to the first input node S of the SR latch 181, when the second comparison voltage Vrc2 of a high logic level is supplied to the second input node R of the SR latch 181, the SR latch 181 outputs the first output signal L1 of a high logic level to the first output node QN and outputs the second output signal L2 of a low logic level to the second output node Q. The low logic level of the second comparison voltage Vrc2 is changed to a high logic level in response to the second output signal L2 of a low logic level. At this time, when the first output signal L1 of a high logic level is supplied to the first comparison voltage generator 120, the level of the first comparison voltage Vrc1 becomes a low logic level. Moreover, because of the first capacitor 121, the level of the first comparison voltage Vrc1 is gradually lowered.

As described above, in the period T1-T3, one cycle of the second output signal L2 can be outputted. When a subsequent operation (that is, period T4-T6) is performed as in the period T1-T3, the second output signal L2 is outputted as the clock signal CLK having a certain frequency. Accordingly, in the oscillator, the reference voltage VREF and the levels of the first and second comparison voltages Vrc1 and Vrc2 influence the frequency of the clock signal CLK.

Figure 3:
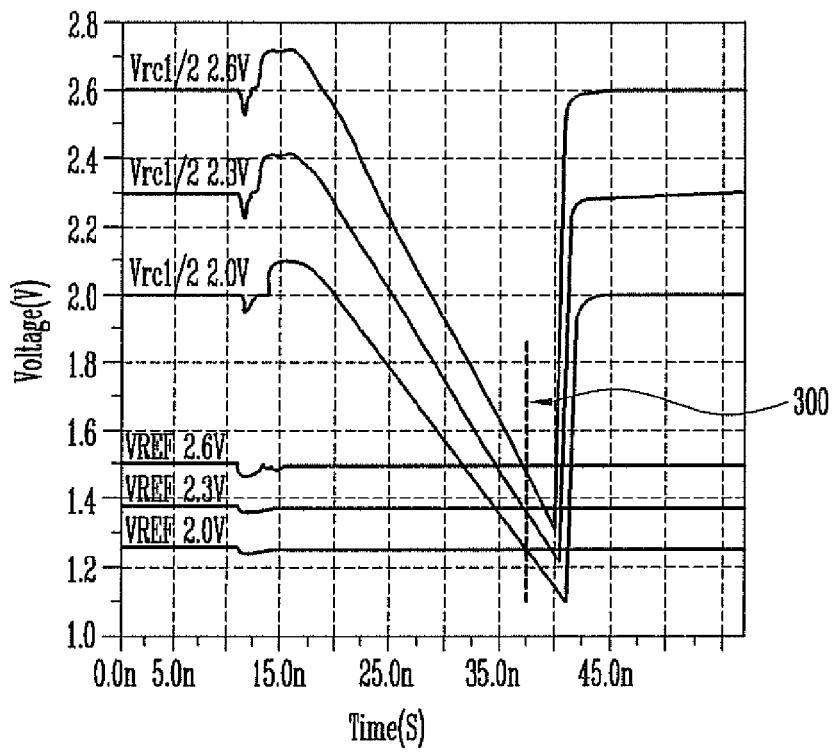
FIGS. 3 and 4 are graphs illustrating the reference voltage of the oscillator shown in FIG. 1.
Figure 4:
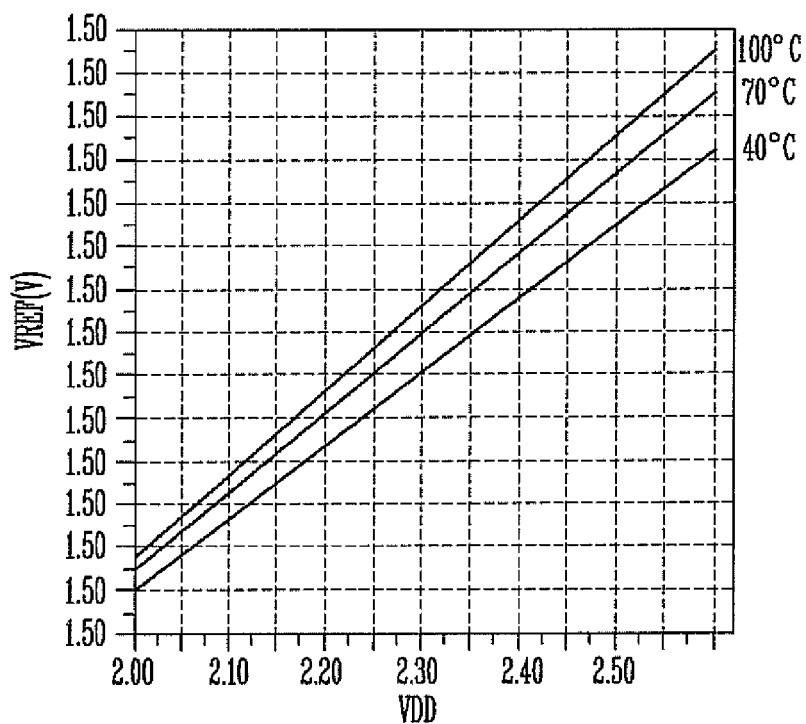

FIGS. 3 and 4 are graphs illustrating the reference voltage of the oscillator shown in FIG. 1. FIG. 3 is a diagram illustrating a change in the reference voltage according to a change in the external voltage VDD. In particular, FIG. 3 shows three traces of the reference voltage VREF for three different external voltages VDD (e.g., 2.0V, 2.3V, and 2.6V). FIG. 3 also shows three traces of the first and second comparison voltages Vrc1 and Vrc2 for the three different external voltages VDD. Meanwhile, FIG. 4 is a diagram illustrating a change in the reference voltage according to a change in the temperature.

From FIGS. 3 and 4, it can be seen that the reference voltage VREF is proportional to the level of the external voltage VDD. Moreover, the first and second comparison voltages Vrc1 and Vrc2 are generated at nodes coupled to the external voltage terminal VDD through the second switch M2 and the fifth switch M5, respectively. Accordingly, when the external voltage VDD rises, the reference voltage VREF rises, and therefore, the levels of the first and second comparison voltages Vrc1 and Vrc2 also rise. Thus, although the external voltage VDD rises, the frequency of the clock signal CLK outputted through the SR latch 181 is not changed. Furthermore, when the external voltage VDD is lowered, the reference voltage VREF is lowered, and therefore, the levels of the first and second comparison voltages Vrc1 and Vrc2 are lowered. Thus, although the external voltage VDD is lowered, the frequency of the clock signal CLK outputted through the SR latch 181 is not changed. In particular, when the levels of the first and second comparison voltages Vrc1 and Vrc2 are lowered by a discharge operation, the third and sixth switches M3 and M6 are turned on in response to the reference voltage VREF. The levels of the first and second comparison voltages Vrc1 and Vrc2 may be changed in proportion to the level of the reference voltage VREF. Accordingly, a point in time (300 in FIG. 3) at which the first and second comparison voltages Vrc1 and Vrc2 become lower than the reference voltage VREF is constant irrespective of a change in the external voltage VDD.

Referring to FIG. 4, when temperature of the internal circuit rises, the resistance values of the resistors R1, R2, and R3 are lowered, and therefore, the amount of current flowing through them is increased. Accordingly, the level of the reference voltage VREF rises.

Although the external voltage VDD and temperature are changed as described above, the level of the reference voltage VREF can be changed, and the levels of the first and second comparison voltages Vrc1 and Vrc2 can be changed according to the change in the level of the reference voltage VREF. Accordingly, since the signals supplied to the input terminals of the SR latch compensate for changes in external voltage and temperature, the frequency of the clock signal CLK outputted from the oscillator remains constant.

According to this disclosure, the reference voltage generated by the reference voltage generator is shared by the switch circuits and the comparators of the oscillator. Thus, although the external voltage and temperature are changed, the clock signal having a certain frequency can be outputted by compensating for the change. Accordingly, reliability of devices generating internal clocks can be improved using an oscillator in accordance with the present application.

What is claimed is:

1. An oscillator, comprising:
   a reference voltage generator configured to generate a reference voltage varying according to a change in temperature and an external voltage;
   a first comparison voltage generator configured to output a first comparison voltage to a first node in response to the reference voltage;
   a second comparison voltage generator configured to output a second comparison voltage to a second node in response to the reference voltage;
   a first comparison circuit configured to compare the reference voltage and the first comparison voltage, and to generate a first input voltage as a result of the comparison;
   a second comparison circuit configured to compare the reference voltage and the second comparison voltage, and to generate a second input voltage as a result of the comparison; and
   a clock generator configured to output a clock signal that oscillates in response to the first and second input voltages.

2. The oscillator of claim 1, wherein the reference voltage generator comprises a first resistor and a diode which are coupled in series between a ground terminal and an external voltage terminal having the external voltage.

3. The oscillator of claim 2, wherein:
the diode is implemented using an NMOS transistor having a source and a gate coupled together, and
voltage supplied to the source of the NMOS transistor is outputted as the reference voltage.

4. The oscillator of claim 1, wherein the first comparison voltage generator delays the discharge time of the first node according to a change in a level of the reference voltage.

5. The oscillator of claim 4, wherein the first comparison voltage generator comprises:
a second switch configured to transfer the external voltage to the first node;
a first capacitor configured to delay the discharge time of the first node;
a third switch configured to control discharging of the first node according to the level of the reference voltage; and
a second resistor and a fourth switch coupled in series between the third switch and a ground terminal.

6. The oscillator of claim 5, wherein the second switch is implemented using a PMOS transistor for coupling the first node and an external voltage terminal having the external voltage in response to a first output signal generated by the clock generator.

7. The oscillator of claim 5, wherein the third switch is implemented using an NMOS transistor that turns on/off in response to the reference voltage.

8. The oscillator of claim 6, wherein the fourth switch is implemented using an NMOS transistor that turns on/off in response to the first output signal.

9. The oscillator of claim 1, wherein the second comparison voltage generator delays the discharge time of the second node according to a change in a level of the reference voltage.

10. The oscillator of claim 9, wherein the second comparison voltage generator comprises:
a fifth switch configured to transfer the external voltage to the second node;
a second capacitor configured to delay the discharge time of the second node;
a sixth switch configured to control discharging of the second node according to the level of the reference voltage; and
a third resistor and a seventh switch coupled in series between the sixth switch and the ground terminal.

11. The oscillator of claim 10, wherein the fifth switch is implemented using a PMOS transistor for coupling the second node and an external voltage terminal having the external voltage in response to a second output signal generated by the clock generator.

12. The oscillator of claim 10, wherein the sixth switch is implemented using an NMOS transistor that turns on/off in response to the reference voltage.

13. The oscillator of claim 11, wherein the seventh switch is implemented using an NMOS transistor that turns on/off in response to the second output signal.

14. The oscillator of claim 1, wherein when an enable signal is activated, the first comparison circuit compares the reference voltage and the first comparison voltage and outputs the first input voltage to a first input node.

15. The oscillator of claim 1, wherein when an enable signal is activated, the second comparison circuit compares the reference voltage and the second comparison voltage and outputs the second input voltage to a second input node.

16. The oscillator of claim 1, wherein the clock generator is implemented using an SR latch for outputting a first output signal to a first output node and a second output signal of the clock signal to a second output node, in response to the first input voltage and the second input voltage.

17. The oscillator of claim 16, wherein the clock signal is the first output signal or the second output signal.

18. The oscillator of claim 1, wherein the clock signal oscillates at a predetermined frequency.

19. The oscillator of claim 1, further comprising a first reset circuit coupled to an output node of the first comparison circuit and configured to reset the output node of the first comparison circuit when an enable signal is deactivated.

20. The oscillator of claim 19, wherein the first reset circuit is implemented using an NMOS transistor.

21. The oscillator of claim 1, further comprising a second reset circuit coupled to an output node of the second comparison circuit and configured to reset the output node of the second comparison circuit when an enable signal is deactivated.

22. The oscillator of claim 21, wherein the second reset circuit is implemented using a PMOS transistor.

* * * * *